US012675042B2

(12) United States Patent
Rhinow et al.

(10) Patent No.: US 12,675,042 B2
(45) Date of Patent: Jul. 7, 2026

(54) METHOD AND APPARATUS FOR PROCESSING A LITHOGRAPHIC MASK

(71) Applicant: Carl Zeiss SMT GmbH, Oberkochen (DE)

(72) Inventors: Daniel Rhinow, Frankfurt am Main (DE); Bartholomaeus Szafranek, Ober-Ramstadt (DE); Joachim Welte, Darmstadt (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 779 days.

(21) Appl. No.: 18/081,820

(22) Filed: Dec. 15, 2022

(65) Prior Publication Data

US 2023/0113702 A1    Apr. 13, 2023

Related U.S. Application Data

(63) Continuation of application No. PCT/EP2021/067233, filed on Jun. 23, 2021.

(30) Foreign Application Priority Data

Jun. 30, 2020    (DE) ......................... 102020208183.2

(51) Int. Cl.
*G03F 1/74*        (2012.01)
*G03F 1/86*        (2012.01)
(Continued)

(52) U.S. Cl.
CPC ................. *G03F 1/74* (2013.01); *G03F 1/86* (2013.01); *H01J 37/1471* (2013.01); *H01J 37/244* (2013.01); *H01J 37/317* (2013.01)

(58) Field of Classification Search
CPC ...... G03F 1/74; G03F 1/86; G03F 1/72; H01J 37/1471; H01J 37/244; H01J 37/317; H01J 2237/31732
See application file for complete search history.

(56) References Cited

U.S. PATENT DOCUMENTS 5,569,392 A * 10/1996 Miyoshi ................... G03F 1/74
                                                          216/81
5,965,301 A    10/1999 Nara et al.
(Continued)

FOREIGN PATENT DOCUMENTS

DE        10030143 A1 *  5/2001    ............... G03F 1/72
DE        10261035        10/2003    ............... G03F 1/00
(Continued)

OTHER PUBLICATIONS

Invitation to Pay Additional Fees and Partial Search Report for International Application No. PCT/EP2021/067233, dated Oct. 20, 2021.

(Continued)

*Primary Examiner* — David A Vanore
(74) *Attorney, Agent, or Firm* — Fish & Richardson P.C.

(57)        ABSTRACT

Methods for repairing a defect of a lithographic mask with a particle beam are described. One such method can comprise the following steps: Processing the defect with the particle beam with a first set of processing parameters; processing the defect with the particle beam with a second set of processing parameters; wherein at least one parameter from the first set of processing parameters differs from the second set of processing parameters.

20 Claims, 4 Drawing Sheets

Recording image information with regard to a defect
410

Creating a repair shape
420

Selecting at least one first pixel of the defect and at least one second pixel of the defect
430

Creating drift correction markers
440

Processing the defect with the particle beam with a first set of processing parameters
450

Drift correction during the repair process
460

Processing the defect with the particle beam with a second set of processing parameters
470

Recording image information with regard to the defect for "end pointing"
480

Recording image information for verifying the repair of the defect
490

(51) Int. Cl.
  *H01J 37/147*     (2006.01)
  *H01J 37/244*     (2006.01)
  *H01J 37/317*     (2006.01)

(56)          References Cited

U.S. PATENT DOCUMENTS

| | | | |
|---|---|---|---|
| 11,256,168 B2 * | 2/2022 | Budach | H01J 37/00 |
| 11,996,267 B2 * | 5/2024 | Maas | G03F 7/70591 |
| 2003/0047691 A1 | 3/2003 | Musil et al. | |
| 2003/0215722 A1 | 11/2003 | Kanamitsu et al. | |
| 2014/0255831 A1 | 9/2014 | Hofmann et al. | |
| 2017/0062180 A1 | 3/2017 | Budach et al. | |
| 2017/0248842 A1 | 8/2017 | Oster et al. | |
| 2019/0354019 A1 | 11/2019 | Freytag et al. | |
| 2019/0391482 A1 | 12/2019 | Oster et al. | |
| 2020/0159111 A1 | 5/2020 | Welte | |
| 2021/0110996 A1 | 4/2021 | Rhinow et al. | |
| 2021/0132594 A1 | 5/2021 | Budach et al. | |
| 2021/0247336 A1 * | 8/2021 | Baralia | G03F 1/84 |
| 2023/0113702 A1 * | 4/2023 | Rhinow | G03F 1/86 |
| | | | 430/5 |

FOREIGN PATENT DOCUMENTS

| | | | |
|---|---|---|---|
| DE | 102013203995 | 9/2014 | H01L 21/027 |
| DE | 102016203094 | 8/2017 | G03F 1/72 |
| DE | 102018207882 | 11/2019 | G16Z 99/00 |
| DE | 102018209562 | 12/2019 | G01N 23/20008 |
| DE | 102018210522 | 1/2020 | H01J 37/304 |
| DE | 102020208183 A1 * | 12/2021 | G03F 1/74 |
| JP | 2000-347385 | 12/2000 | G03F 1/08 |
| JP | 2003-121986 | 4/2003 | G03F 1/08 |
| JP | 2006-128358 | 5/2006 | H01L 21/027 |
| JP | 2006128358 A * | 5/2006 | |
| JP | 2008-185931 | 8/2008 | G03F 1/08 |
| JP | 2012-178236 | 9/2012 | H01J 37/22 |
| JP | 2014-082240 | 5/2014 | H01L 21/027 |
| JP | 2017-075935 | 4/2017 | G01Q 60/30 |
| KR | 20230019980 A * | 2/2023 | H01J 37/1471 |
| TW | 201842401 | 12/2018 | G03F 1/72 |
| WO | WO 01/68938 | 9/2001 | C23C 14/34 |
| WO | WO-2006128358 A1 * | 12/2006 | B60C 17/066 |
| WO | WO 2009/106288 | 9/2009 | G03F 1/00 |
| WO | WO-2022002728 A1 * | 1/2022 | G03F 1/74 |

OTHER PUBLICATIONS

International Search Report and Written Opinion of the International Searching Authority for International Application No. PCT/EP2021/067233, dated Dec. 14, 2021.

First Office Action issued by the German Patent Office for Application No. DE 10 2020 208 183.2, dated Feb. 11, 2021 (With English Machine Translation).

Second Office Action issued by the German Patent Office for Application No. DE 10 2020 208 183.2 dated May 10, 2022 (With English Machine Translation).

Notice of Examination Opinion issued by the Taiwan Intellectual Property Office for Application No. TW 110123164 dated Dec. 9, 2022 (with English Translation).

Office Action issued by the Japanese Patent Office for Application No. JP 2023-500052, dated Sep. 2, 2024 (English Translation Only).

Office Action issued by the Japanese Patent Office for Application No. JP 2023-500032, dated Jan. 22, 2024 (English Translation Only).

* cited by examiner

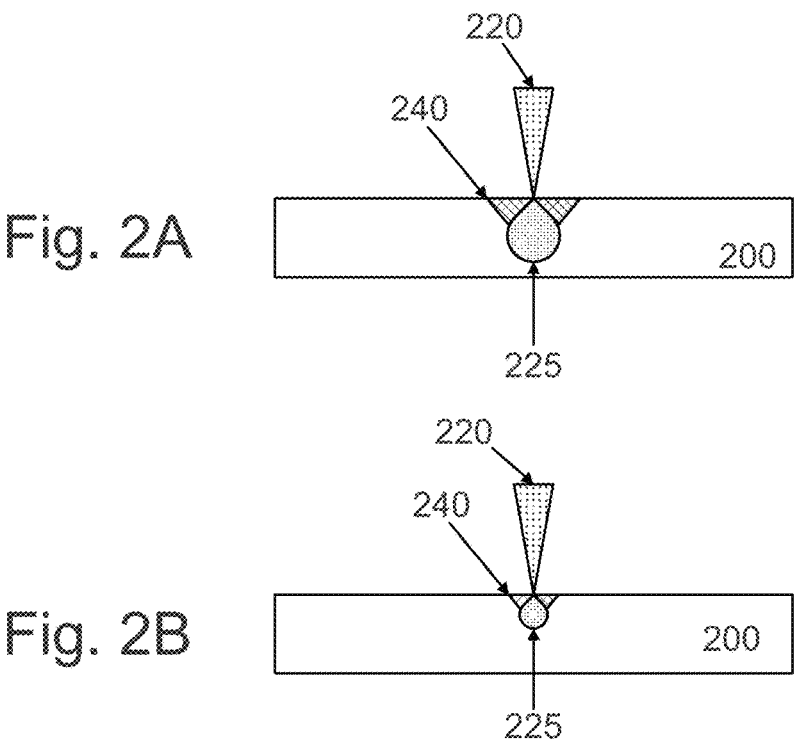
Fig. 2A
Fig. 2B
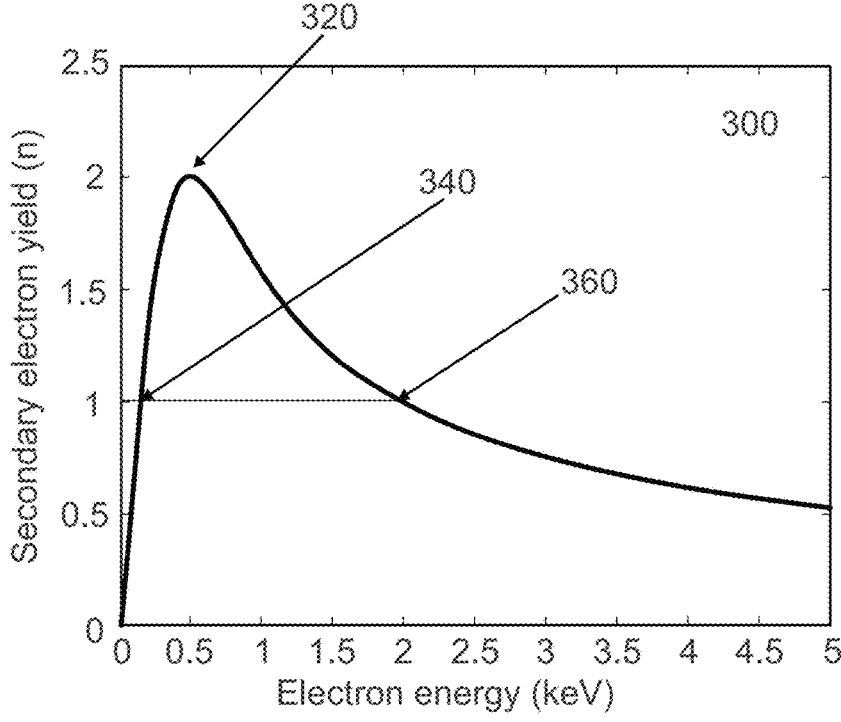
Fig. 3

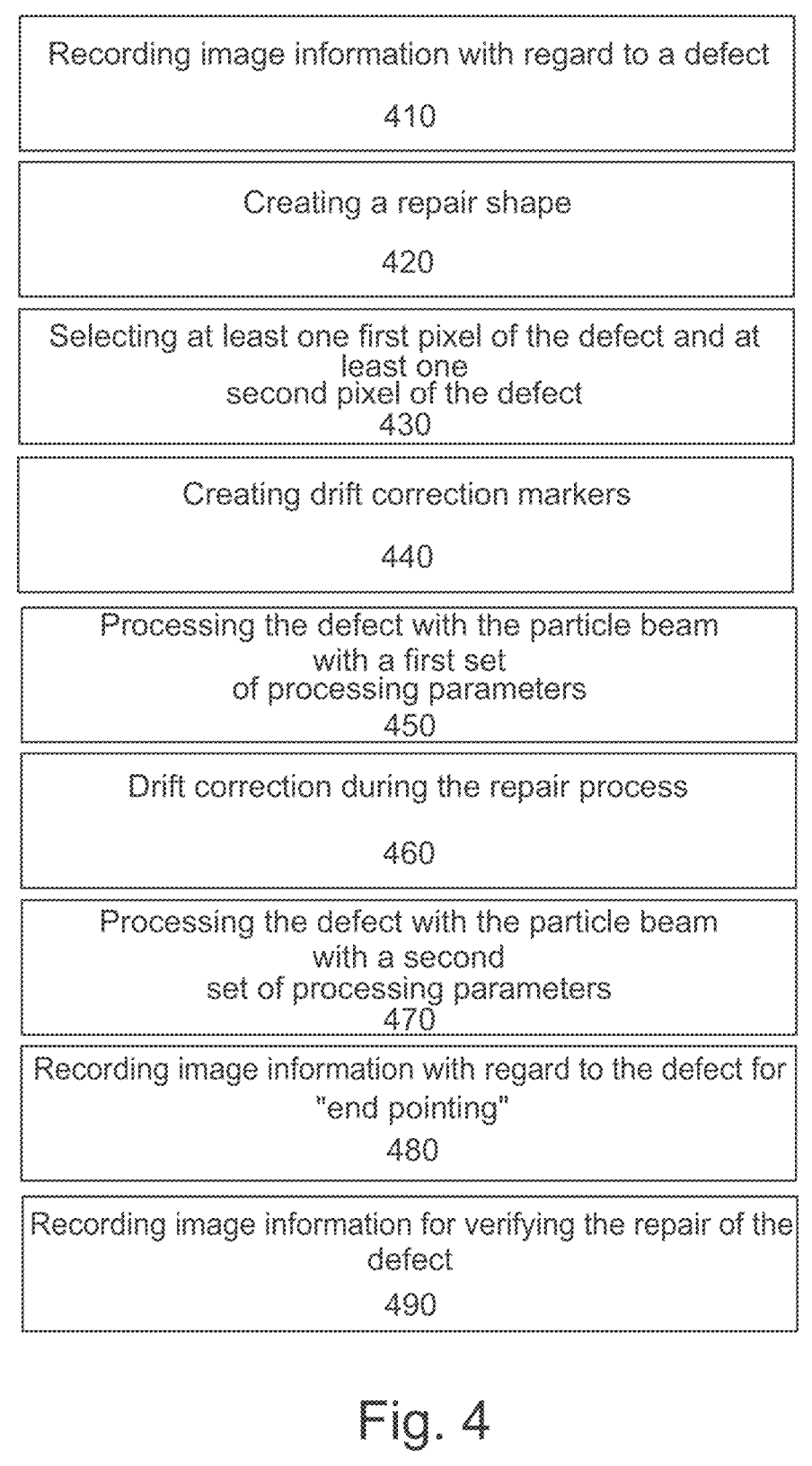

Recording image information with regard to a defect

410

Creating a repair shape

420

Selecting at least one first pixel of the defect and at least one
second pixel of the defect
430

Creating drift correction markers

440

Processing the defect with the particle beam
with a first set
of processing parameters
450

Drift correction during the repair process

460

Processing the defect with the particle beam
with a second
set of processing parameters
470

Recording image information with regard to the defect for
"end pointing"
480

Recording image information for verifying the repair of the
defect
490

Fig. 4

METHOD AND APPARATUS FOR PROCESSING A LITHOGRAPHIC MASK

CROSS-REFERENCE TO RELATED APPLICATIONS

This application is a continuation of and claims priority under 35 U.S.C. § 120 from PCT Application No. PCT/EP2021/067233, filed on Jun. 23, 2021, which claims priority from German patent application DE 10 2020 208 183.2, filed on Jun. 30, 2020, and entitled "Verfahren and Vorrichtung zum Bearbeiten einer lithograghischen Maske." The entire contents of each of the above priority applications are incorporated herein by reference.

TECHNICAL FIELD

The present invention relates to methods and apparatuses for processing a lithographic mask, in particular for repairing a defect of a lithographic mask.

BACKGROUND

As a consequence of the constantly increasing integration density in microelectronics, lithographic masks have to image structure elements that are becoming ever smaller into a photoresist layer of a wafer. In order to meet these requirements, the exposure wavelength is being shifted to ever shorter wavelengths. At the present time, argon fluoride (ArF) excimer lasers are principally used for exposure purposes, these lasers emitting light at a wavelength of 193 nm. Intensive work is being done in regard to light sources which emit in the extreme ultraviolet (EUV) wavelength range (10 nm to 15 nm), and corresponding EUV masks. In order to increase the resolution capability of wafer exposure processes, a number of variants of the conventional binary photolithographic masks have been developed simultaneously. Examples thereof are phase masks or phase shifting masks and masks for multiple exposure.

On account of the ever decreasing dimensions of the structure elements, lithographic masks, in particular photolithographic masks, cannot always be produced without defects. Owing to the costly production of photomasks, defective photomasks, whenever possible, are repaired. Two important groups of defects of photolithographic masks are, firstly, dark defects. These are locations at which absorber or phase shifting material is present, but which should be free of this material. These defects are repaired by removing the excess material preferably with the aid of a local etching process. Secondly, there are so-called clear defects. These are defects on the photomask which, upon optical exposure in a wafer stepper or wafer scanner, have a greater light transmissivity than an identical defect-free reference position. In mask repair processes, these defects can be eliminated by depositing a material having suitable optical properties. Ideally, the optical properties of the material used for the repair should correspond to those of the absorber or phase shifting material.

Defects can furthermore be subdivided into printable and non-printable defects. During exposure of a wafer, photomasks having printable defects or printable mask defects produce a pattern that does not fulfil all of the design stipulations. By contrast, during exposure of a wafer, a mask having one or more non-printable defects generates a pattern on the wafer that fulfils all of the design stipulations.

The applicant develops and manufactures measuring apparatuses for analyzing photolithographic masks that are sold for example under the trade names PROVE®, AIMS™ or WLCD. Furthermore, the applicant develops and sells repair apparatuses for photolithographic masks that are known for example under the trade names MeRiT®, RegC® or ForTune®.

The repair is typically effected with a particle beam (comprising, e.g., electrons, ions, atoms, molecules and/or photons) with specific intrinsic beam parameters. Together with a precursor gas to which the mask is exposed, the particle beam excites a local chemical reaction at the mask under defined process parameters. In this case, material can be deposited locally on the mask or material can be etched locally from the mask.

The same particle beam with the same intrinsic beam parameters is typically used not only for the actual repair process in which a defect is removed, but also for previous, downstream or intermittent examination or characterization of the mask. For example, an image of the mask can be recorded (e.g. with the aid of an electron beam) in order to ascertain the so-called repair shape, which describes the defects to be repaired (the repair shape usually indicates the pixels to be exposed for a repair and optionally the exposure duration for the individual pixels or some other measure of the local depth of the defect and optionally further parameters for repairing the pixels).

The defects are then removed according to the repair shape with the aid of the particle beam and a suitable precursor gas under the predetermined processing parameters, e.g. by pixel-by-pixel exposure with the particle beam. Image information can then also be used to determine whether a specific repair target has been achieved.

An apparatus and corresponding methods for repairing defects are disclosed in WO 2009 106 288 A2. During a processing step, an electron beam is used to eliminate a defect with the aid of an electron-beam-induced local chemical reaction. In a separate measuring step, the electron beam can be used to establish, with the aid of a detection of backscattered electrons, whether an end point has been reached. In the measuring step, it is possible to choose a different dwell time of the electron beam, a different sequence, repetition rate ("refresh time") or a different gas flow compared with during the processing process.

The present invention addresses the problem of improving the known approaches for repairing and respectively processing masks, in particular when defects with extensive and/or small structures are present.

SUMMARY

This problem is at least partly solved by the various aspects of the present invention.

In accordance with a first aspect, a method for repairing a defect of a lithographic mask with a particle beam is provided. The defect is processed with the particle beam with a first set of processing parameters. The same defect is processed with a second set of processing parameters. At least one parameter from the first set of processing parameters differs from the second set of processing parameters.

Instead of the routine procedure in the prior art of removing a defect uniformly with a particle beam with exactly the same processing parameters, the defect is thus processed with different processing parameters. This makes it possible, for example, for the processing parameters in different work steps that are directed for example to different regions of the defect (e.g. regions lying next to one another/adjacent regions or regions lying one above another) to be optimized towards the requirements of the respective work step or region. The quality and/or the speed of the repair can thus be increased. In particular, therefore, even in the case of defects with fine structures, it is possible to achieve high quality with minimal processing time, e.g. by virtue of only the fine structures of the defect being processed with high precision (and low speed), whereas the coarse structures of the defect are processed with suitable (sufficient) lower precision (and in return higher speed).

The processing with the first and second sets of processing parameters can comprise local particle-beam-induced etching and/or deposition and should be differentiated in particular from a pure diagnosis process. The processing parameters can thus be changed during the overall processing process comprising the (sub-)processes "processing with the first set of processing parameters" and "processing with the second set of processing parameters."

By way of example, (exclusively) a first section of the defect can be repaired with the aid of the first set of processing parameters. By way of example, (exclusively) a second section of the defect can be repaired with the aid of the second set of processing parameters, said second section not overlapping the first section (disjoint during a projection into the mask plane).

The defining of a repair shape and/or the processing of defects can be effected pixel by pixel (e.g., in accordance with a repair shape). A typical pixel size for creating a repair shape is for example 1.5 nm*1.5 nm (however, it is also possible to use other sizes, e.g. 1 nm*1 nm, 2 nm*2 nm, or 3 nm*3 nm, etc.). It is then possible to effect processing with a particle beam which has an extent of similar size (i.e., the area or effective diameter of which upon impinging on the defect is of corresponding size). However, it may also be advantageous to perform the exposure at least in part for a plurality of pixels simultaneously, i.e., to choose the size of the particle beam (i.e., the area or effective diameter thereof upon impinging on the defect) to be correspondingly larger than the pixel size used when creating the repair shape (a typical size of the particle beam can lie, e.g., in the range of 6 nm*6 nm or more, if e.g. an electron beam with an energy of 400 eV to 1 keV is used). Each pixel or each region of pixels (according to the effective diameter of the particle beam respectively used) is exposed for a specific duration (exposure duration or "dwell time"). The exposure is repeated in successive cycles until exposure with the required dose has been effected. Hereinafter the term pixel size—depending on context—refers to the pixel size used for creating the repair shape or to the size of the particle beam.

In accordance with a further aspect of the invention, for example for at least one first (region of) pixel(s) of the defect it is then possible to effect the processing with the first set of processing parameters. For at least one other, second (region of) pixel(s) of the defect it is possible to effect the processing with the second set of processing parameters. It is possible for example to effect a classification on the basis of conditions to be met for individual pixels. One specific (first set of) pixel(s), which e.g. is critical and is therefore intended to be processed accurately, can be processed with corresponding processing parameters that provide the desired accuracy. Another (second set of) pixel(s), which e.g. is less critical and therefore need not be processed as accurately, can be processed with corresponding processing parameters that provide less accuracy but in return a higher processing speed, for example.

For example, a first region or a first set of pixels can be processed (exclusively) with the first set of processing parameters. A disjoint (i.e., neighboring) region or second set of pixels can be processed (exclusively) with the second set of processing parameters. The processing with the first and respectively the second set of processing parameters can be effected in temporal succession but also (at least in part) simultaneously.

The particle beam can comprise an electron beam, an ion beam, an atomic beam, a molecular beam and/or a photon beam.

Processing parameters can be for example intrinsic parameters of the particle beam (hereinafter: intrinsic beam parameters). Intrinsic beam parameters can comprise for example: Parameters representing a pixel size of the particle beam (e.g., in the form of a diameter and/or an area of the particle beam on the mask), a particle type, a particle energy (upon impinging on the mask), a flux or current of the particle beam (proportion of particles per time, if appropriate multiplied by the charge per particle; only the flux or the current is mentioned at some points hereafter, but the respective other term is intended to be concomitantly disclosed as well) and/or a fluence of the particle beam (proportion of particles per time and area of the mask). The variables mentioned can be indicated directly by the respective parameter. However, it is also possible to provide intrinsic beam parameters of an indirect type which at least partly determine only one or more of the variables mentioned, e.g., a primary energy of the particles, an accelerating voltage, a sample voltage (sample bias), a stop, a numerical aperture, a magnification, a type of focusing device, etc. It is also conceivable to provide the beam profile (e.g., use of a round, elliptical, etc. profile upon impinging on the mask), the eccentricity of the beam profile (e.g., use of non-round stops), the offset of a stop from the optical axis (in the case of non-rotationally symmetrical stops: Offset of the centroid of the stop from the optical axis) as intrinsic beam parameters. That is because these can also influence the intensity of the local chemical reaction caused by the beam and thus concomitantly determine the "fineness of the brush," for example.

In some examples, exclusively one or a plurality of intrinsic beam parameters is/are changed. However, in accordance with one aspect of the invention, alternatively or additionally, processing parameters other than intrinsic beam parameters can also play a part (hereinafter: process parameters). For example, gas parameters (type(s) of gas, (partial) pressure, flow, or other parameters that influence the gas chemistry) can be processing parameters that differ between the first and respectively the second set. However, processing parameters can also encompass the type of scanning device and scanning parameters, the gas refresh time (period between two successive time intervals in which the particle beam is applied to the mask, i.e. the period with which individual "exposure pulses" are effected), the step length between pixels (distance between adjacent pixels; referred to as: line step) and/or the scanning direction (line by line in the x-direction, line by line in the y-direction, combination of xy-directions, spiral, randomized or random) and/or the type of scanning device (e.g., column electronics or external deflection device). The scanning direction can be a function of the geometry of the defect, such that the particle beam has to be moved as little as possible in order to repair the defect. The pixel size used when creating the repair shape can also be a processing parameter.

One process parameter (in the broader sense) is also the so-called pixel exposure duration (time period for which the beam exposes a pixel without interruption; referred to as: "dwell time"). In the present case, however, process parameters in the narrower sense are understood only to be all other process parameters, i.e., the pixel exposure duration is not a process parameter in the narrower sense. The process parameters can be parameters of an apparatus used for carrying out the method.

In some examples, the first and second sets of processing parameters can also differ in two or more parameters. Correlation of the differences in the mutually corresponding parameters between the first and second sets of processing parameters is possible. For example, the first set can have a smaller pixel size (of the repair shape or of the particle beam) than the second set, wherein the first set also has a lower beam current (or a lower beam fluence, a lower particle energy).

It can be provided that in the method the processing of a pixel of the defect is effected selectively either with the first or the second set of processing parameters, specifically depending on the position of the pixel in the defect. In this regard, e.g., the position of a pixel can be taken as a basis for predetermining whether said pixel is intended to be processed with the first or second set of processing parameters. A first set and a second (disjoint) set of pixels can be predetermined, e.g., from the totality of the pixels for a defect.

The corresponding first and respectively second processing parameters can be predetermined (i.e., they can be fixed before the assignment of the pixels to the first and respectively the second set). Alternatively or additionally, the processing parameters can also depend at least partly on the first and respectively the second set of pixels which are intended to be processed with the first and respectively the second set of processing parameters. For example, the set of processing parameters for the first and/or second set of pixels can be selected depending on the total area of the pixels of this set. In this regard, particularly in the case of a set of pixels that forms one large continuous area, it is possible to choose a high beam current, a high beam fluence, a high particle energy, a high gas flow and/or a large pixel size of the particle beam. Particularly in the case of a set of pixels that forms one or a plurality of smaller continuous areas, it is possible to choose a low beam current, a low beam fluence, a low particle energy, a low gas flow and/or a small pixel size of the particle beam.

In a similar manner, for a set of pixels that is associated with a larger depth of the defect, it is possible to use, e.g., a high beam current, a high beam fluence, a high particle energy and/or a high gas flow (the opposite for a set of pixels that is associated with a smaller depth of the defect).

In accordance with one aspect of the invention, it is also possible to choose a first and/or second pixel size of the particle beam (as processing parameter) for the repair of a defect depending on the first and/or respectively second set of pixels. In particular, it is possible to select the pixel size of the particle beam for the first and/or respectively second set of pixels depending on the total area of the pixels of the respective set. For example, the pixel size of the particle beam can be chosen such that the respective area can be covered as far as possible with an integral number of pixels. This may acquire importance independently of whether there is available for the repair only one set or else a plurality of sets of pixels that are processed with a set of processing parameters. Specifically, it may also be advantageous to optimize the pixel size accordingly, even if the defect is intended to be repaired only with a single set of processing parameters.

At least one marginal pixel of the defect can be processed with the first set of processing parameters and/or at least one non-marginal pixel of the defect can be processed with the second set of processing parameters. For example, a set of processing parameters that provides a high resolution can be used for the marginal pixel. A low beam current, a low fluence, a low particle energy, a low gas flow and/or a small pixel size (e.g., of the particle beam) can be provided (parameters for high resolution). A set of processing parameters that yields a lower resolution, but in return allows a higher processing speed, can be used for the non-marginal pixel. A higher beam current, a higher beam fluence, a higher particle energy, a higher gas flow and/or a larger pixel size (e.g., of the particle beam) can be provided (parameters for low resolution). In this regard, figuratively speaking an extensive defect can be processed with a "coarse brush" in its interior, whereas it is processed with a "fine brush" in its marginal regions. In this regard, different operating points can be provided, e.g., a high-resolution/high-precision operating point and a fast operating point with high throughput.

By way of example, a defect can be classified into a marginal region with marginal pixels and into a non-marginal region with non-marginal pixels. The non-marginal pixels (also referred to as volume pixels) can be distinguished by the fact that they are surrounded by further pixels of the defect. The marginal pixels can be identified by the fact that no pixels of the defect are arranged around them at least in part. Alternatively, a differentiation can also be made as follows: Pixels are marginal pixels if the distance between their center point or centroid and a marginal contour of the defect lies below a predetermined threshold (this permits a plurality of rows of marginal pixels). Such a predetermined threshold can have, e.g., a value of 1-25 nm, or 1-15 nm, or 1-5 nm, e.g., 25 nm, 15 nm or 5 nm.

Alternatively or additionally, a subdivision of the marginal pixels into edge pixels and non-edge pixels is also possible. Non-edge pixels are such marginal pixels which do not adjoin an edge planned following the repair (or whose center point or centroid is at a distance from an edge planned following the repair which lies above the predetermined threshold). By contrast, edge pixels are such marginal pixels which adjoin an edge planned following the repair (or whose center point or centroid is at a distance from an edge planned following the repair which does not exceed the predetermined threshold). Thus, e.g. increased requirements can be made of the precision (only) for edge pixels that define the edge planned following the repair.

At least one edge pixel of the defect can be processed with the first set of processing parameters and/or at least one non-edge pixel of the defect can be processed with the second set of processing parameters. For example, a set of processing parameters that provides a high resolution can be used for the edge pixel. A low beam current, a low fluence, a low particle energy, a low gas flow and/or a small pixel size (e.g., of the particle beam) can be provided (parameters for high resolution). A first set of processing parameters that yields a lower resolution, but in return allows a higher processing speed, can be used for the non-edge pixel. A higher beam current, a higher beam fluence, a higher particle energy, a higher gas flow and/or a larger pixel size (e.g., of the particle beam) can be provided (parameters for low resolution). Volume pixels can likewise be processed with the first set of processing parameters. Alternatively, however, it is also possible to process them with a dedicated set of parameters that has an (even) higher beam current, an (even) higher beam fluence, an (even) higher particle energy, an (even) higher gas flow and/or an (even) larger pixel size (e.g., of the particle beam) than the second (first) set of processing parameters.

By way of example, pixels can be divided into at least two of the following types of pixels: Volume pixels, edge pixels and non-edge pixels. For each of the two or more types it is possible to use a different set of processing parameters, as described herein.

In one example, the pixels are classified into a first set of pixels comprising volume pixels and non-edge pixels, and into a second set of pixels comprising edge pixels. The first set of pixels can be processed with a set of processing parameters for low resolution. The second set of pixels can be processed with a set of processing parameters for high resolution.

The at least one parameter from the first set of processing parameters can comprise at least one of the following elements: a lower beam current, a lower beam flux, a lower beam fluence, a lower particle energy, a smaller pixel size (e.g., of the particle beam) than defined by the second set of processing parameters. Consequently, regions of the defect that are processed with the first set can be processed more finely and regions that are processed with the second set can be processed only more coarsely, but generally more rapidly. For example, a defect can firstly be processed with the second set of processing parameters, for example in order to coarsely remove the defect rapidly. Afterwards, the defect can then be processed with the first set of processing parameters (with a lower beam current, a lower beam flux, etc. as explained above) in order to remove finer details of the defect. It is also possible firstly to begin with the first set of processing parameters and only afterwards to process the defect with the second set of processing parameters (i.e., with a higher beam current, a higher beam flux, etc.). In this case, the pixel size can refer to a pixel size used when creating the repair shape and/or to a pixel size of the particle beam.

For example, the first set of processing parameters can be used for processing one or more edge pixels (and/or marginal pixels). The second set of processing parameters can be used for example for processing non-edge pixels and/or volume pixels (and/or non-marginal pixels).

It is alternatively or additionally also possible for the first set of processing parameters to comprise at least one of the following elements: a higher beam current, a higher beam flux, a higher beam fluence, a higher particle energy, a larger pixel size (e.g., of the particle beam) than defined by the second set of processing parameters.

A defect can be understood as a (geometrically) continuous set of pixels to be exposed for the repair of the mask.

It also lies within the scope of the present invention to process a first defect with a first set of processing parameters, in particular intrinsic beam parameters, and to process a second defect with a second set of processing parameters, in particular intrinsic beam parameters. At least one parameter from the first set of processing parameters differs from the second set of processing parameters. In this regard, the processing parameters, in particular the intrinsic beam parameters, can be optimized toward the respective defect. In this case, the processing parameters (as described above with regard to a region of a defect) can be optimized for example depending on the geometry of the defect. Defects having larger areas can be processed with a high beam current, a high beam fluence, a high particle energy, a high gas flow and/or a large pixel size (e.g. of the particle beam) (the opposite in each case for defects having smaller areas). In a similar manner, for a defect that is associated with a larger depth, it is possible to use, e.g., a high beam current, a high beam fluence, a high particle energy and/or a high gas flow (the opposite for a defect that is associated with a smaller depth). Moreover, it is possible to optimize the pixel size during the repair of a defect. For example, the pixel size (of the repair shape and/or of the particle beam) can be chosen such that the respective defect can be covered as far as possible with an integral number of pixels. The first and second defects can both be dark defects or else both be bright defects. The first and second defects can be included in a common repair shape. The first and second defects can be repaired for example temporally successively, in an alternating manner (in parallel) or simultaneously, e.g., without the mask being removed in the course of this from a corresponding apparatus that provides the particle beam.

It is pointed out that, in some examples, not just a first and second set of processing parameters can be provided for processing one or more defects. It is also possible to process a defect with three or more different sets of processing parameters (at least one parameter being different in each case) or to process three or more defects with respectively different sets of processing parameters.

One aspect of the invention is to predetermine the sets of processing parameters and the associated pixels (of a defect). In this regard, an optimization of the processing parameters towards the respective (regions of the) defects is made possible. Accordingly, information about a defect can be received. At least partly on the basis thereof, it is then possible to effect an assignment of the pixels of the defect to a first and/or respectively second (set of) pixel(s) and/or a selection of the first and/or respectively second set of processing parameters.

In accordance with one aspect, provision is also made for implementing different processing parameters with a plurality of particle beams instead of different sets of processing parameters with one particle beam. For example, a first (region of a) defect can be processed with a first particle beam (with a first set of processing parameters) and a second (region of the) defect can be processed with a second particle beam (with a first set of processing parameters). Simultaneous or at least partly temporally successive processing with the first and respectively the second particle beam is conceivable.

In accordance with a further aspect, an apparatus for repairing a defect of a lithographic mask with a particle beam is provided. The apparatus comprises a means for providing a particle beam and a means for receiving information about the defect. Furthermore, the apparatus has a means for determining at least one first region of the defect for processing with the particle beam with a first set of processing parameters and at least one second region of the defect for processing with the particle beam with a second set of processing parameters, on the basis of the information, wherein at least one parameter from the first set of processing parameters differs from the second set of processing parameters.

The processing with the first and second sets of processing parameters can comprise local particle-beam-induced etching and/or deposition and should be differentiated in particular from a pure diagnosis process. The apparatus can be embodied such that the second region does not overlap the first section (disjoint during a projection into the mask plane). For example, exclusively the first section of the defect can be repaired with the aid of the first set of processing parameters. For example, exclusively the second section of the defect can be repaired with the aid of the second set of processing parameters.

The processing of defects is usually effected pixel by pixel (e.g., in accordance with a repair shape).

The apparatus can accordingly have a means for determining at least one first pixel of the defect for processing with the particle beam with a first set of processing parameters and at least one second pixel of the defect for processing with the particle beam with a second set of processing parameters, on the basis of the information, wherein at least one parameter from the first set of processing parameters differs from the second set of processing parameters.

The methods described herein can thus be carried out with the aid of the apparatus. In particular, the apparatus can receive information about the defect. A first and a second pixel (or sets of first and second pixels) are then determined on the basis of the received information. By way of example, the selection can be effected as described above with regard to the method. Consequently, different regions of a mask can be processed in an optimized manner according to the respective local requirements. The first and second pixels or the first and second sets of pixels can be configured such that they do not overlap, i.e., are arranged next to one another on the mask.

The apparatus can be configured such that the means for receiving information is designed to receive information about the geometry of the defect. The means for determining can thus perform the assignment of the pixels of the defect and/or a selection of the first and/or second set of processing parameters on the basis of the geometry of the defect. The means for determining can, e.g., depending on the size of the respective defect, define pixel assignments and/or processing parameters suitable therefor and/or propose them to the user of the apparatus for definition (e.g., by way of a graphical user interface).

The means for receiving can be designed, for example, to obtain the information from a unit for recording an image (which can likewise be part of the apparatus, e.g., by way of a (scanning) electron microscope or an optical microscope, etc.) of the mask or from a corresponding user interface for input by the user. For example, the sizes of the defects can be ascertained automatically from the image information and/or the repair shape ascertained on the basis thereof.

The means for determining can be configured such that the determination for processing is effected selectively either with the first or the second set of processing parameters depending on the position of the respective pixel in the defect.

It is also possible for the means for receiving and/or the means for determining to comprise a user interface suitable for the input of information by the user and/or for the output of information to the user.

The means for determining can be configured such that the at least one first pixel comprises at least one marginal pixel of the defect and/or the at least one second pixel comprises at least one non-marginal pixel of the defect. For example, software or hardware or a mixture thereof can enable the user of the apparatus to provide information about a predetermined marginal thickness. The means for determining can then classify the pixels of a defect into marginal pixels and non-marginal pixels (marginal pixels are, e.g., such pixels whose center point or centroid is at a distance from a marginal contour of the defect that lies within the predetermined threshold). Alternatively, the means for determining can also use a previously stored value for the marginal thickness for this purpose, without a user input being required. For example, the means for determining can be configured such that it automatically classifies a defect into a set of marginal pixels and non-marginal pixels if its marginal contour exceeds a predetermined measure of complexity and/or if the area of the defect exceeds a predetermined threshold. The user interface can also be configured such that—for a mask or for a region of the mask or for each individual defect—the classification into marginal pixels and non-marginal pixels can be activated or deactivated as an option by the user. Alternatively or additionally, in the manner described above, the marginal pixels can be subdivided into edge pixels and non-edge pixels, in a similar manner to that as explained above with regard to a method.

Moreover, the means for determining (e.g., a computer unit, a processor, etc.) can automatically select the sets of parameters accordingly, e.g., depending on the predetermined marginal thickness (for the marginal pixels or the edge pixels). The smaller the marginal thickness, the more the parameters can be optimized for a high resolution. A semi-automatic selection is also possible, wherein the apparatus offers the user a selection of sets of parameters adapted to the predetermined marginal thickness, from which the user can then make a final selection. Moreover, the means for determining can, e.g., automatically select the set of parameters for the non-marginal pixels, e.g., depending on the area, etc. (as described above). The larger the marginal thickness, the more the parameters can be optimized for a low resolution and correspondingly rapid processing. Moreover, the means for determining can correspondingly automatically choose, e.g., the pixel size (of the repair shape and/or of the particle beam), both for the marginal pixels (in particular the edge pixels and non-edge pixels) and for the non-marginal pixels (as described above with regard to the methods). A semi-automatic selection is also conceivable, wherein the apparatus offers the user a selection of the pixel size adapted to the predetermined marginal thickness and/or the area of the non-marginal pixels and/or edge pixels, from which the user can then make a final selection.

Provision can also be made for the apparatus for repairing a defect of a lithographic mask not to comprise means for providing a particle beam. It can be provided for example as a separate hardware device provided for interaction with a device for providing the particle beam, for example by way of a (software) interface for providing information about the sets of parameters and the (sets of) pixels. In addition or as an alternative to an apparatus for this purpose, a corresponding computer program can also be provided.

A further aspect of the invention relates to a method for processing a lithographic mask. The method comprises a first process, in which a particle beam with a first set of intrinsic beam parameters is guided onto the mask. In a second process, the particle beam with a second set of intrinsic beam parameters is guided onto the mask. At least one parameter from the first set of intrinsic beam parameters differs from the second set of intrinsic beam parameters. In other words, the intrinsic beam parameters are changed during the overall process comprising the (sub-)processes "first process" and "second process."

Instead of, as in the prior art, using the same intrinsic beam parameters throughout (and varying the precursor gas feed at most between the individual processes), the intrinsic beam parameters can thus be optimized towards the type of process. As already explained further above, intrinsic beam parameters can comprise for example: the pixel size of the particle beam (e.g., diameter or area of the particle beam on the mask), fluence, beam current, beam flux, particle energy, particle type (e.g., electrons, photons, (various) atoms, (various) molecules, (various) ions). These can either be indicated directly as intrinsic beam parameters. However, it is also possible to provide intrinsic beam parameters of an indirect type, e.g., accelerating voltage, stop, magnification, numerical aperture, type of focusing device, etc., as already explained.

In some examples, the first process is a diagnostic process. This can involve for example a process for upstream image recording, a process for creating a repair shape, etc. This can also involve a process for creating drift correction markers and/or a process for drift correction. Moreover, this can involve a process for downstream or intermittent image recording, for instance in order to check the progress of the repair. This can involve, e.g., a so-called end pointing process, which ascertains whether material has already been removed to the desired depth and/or whether material has already been deposited with the desired thickness.

Alternatively or additionally, the second process can be a repair process. This can involve for example an etching process and/or a deposition process. The particle beam together with the precursor gas can bring about a local chemical reaction.

Generally, it may be advantageous to carry out a further process between the first process and the second process. Said further process can be a diagnostic process, for example, in which the particle beam, e.g., with the second set of intrinsic beam parameters is guided onto the mask. In this case, a coordination can be effected, for example, which is necessary on account of the variation of the intrinsic beam parameters.

By use of the above-described aspects of the optimization of the individual processes it is possible not just to optimize resolution ("minimum repair size") and the speed of the repair ("throughput"). Rather, e.g. by use of the optimization of the parameters in association with drift correction markers, it is possible to ensure the correct positioning of the repair and to minimize a degradation of the markers and accordingly to reduce the degree of errors reaching the critical dimension (CD) (smaller ACD/CD or smaller edge placement errors). By way of use during end pointing, for example, it is also possible to ensure that the repair is correct, i.e., for example is reliably detected, as soon as a defect at a specific location has been completely removed, with the result that, e.g., over-etching into the substrate of the mask is avoided.

In accordance with one aspect, the particle beam mentioned herein can comprise an electron beam and/or the first set of beam or processing parameters can be designed such that the secondary electron contribution (in the example of the electron beam: per electron of the electron beam) lies in the range of 0.5 to 1.5, preferably in the range of 0.75 to 1.25. Alternatively or additionally, the second set of beam or processing parameters can be designed such that the secondary electron contribution is greater than 1.5, preferably greater than 1.75.

The two sets of parameters can thereby be optimized towards different targets. In the case of imaging of the mask (in the first process), for example, it may be helpful for the mask to be charged as little as possible, such that a secondary electron contribution of approximately 1 is desirable. During the processing of the sample (in the second process), it may be helpful to make the process as stable as possible with regard to energy fluctuations of the particle beam. For this purpose, it may be helpful to configure the particle beam such that the secondary electron contribution is at a local maximum, for example greater than 1.5 or greater than 1.75 or close to 2.

In some examples, the at least one parameter from the first set of intrinsic beam parameters comprises a higher particle energy than defined by the second set of processing parameters. In this regard, for example, during imaging (in the first process) by way of a high particle energy it is possible to achieve a high image resolution (e.g., by way of additional depth information as a result of higher penetration depth; smaller aberrations at higher energies; better signal-to-noise ratio; etc.). During repair, e.g., a lower particle energy can then be used in order to obtain a finer repair resolution.

The methods described herein can furthermore comprise providing at least one precursor gas, such that the particle beam excites a chemical reaction of the at least one precursor gas at the mask. The respective precursor gas can be provided with one or more gas providing parameters (type of gas, partial pressure, gas flow, etc.).

A further aspect of the invention is an apparatus for processing a lithographic mask. The apparatus comprises a means for guiding a particle beam onto the mask. The apparatus furthermore comprises a means for receiving information about a first and a second process. The apparatus additionally comprises means for determining a first and a second set of intrinsic beam parameters for the first and respectively the second process with which the particle beam is intended to be guided onto the mask. At least one parameter from the first set of intrinsic beam parameters differs from the second set of intrinsic beam parameters.

The apparatus can thus contribute to optimizing the sets of intrinsic beam parameters specifically towards the first and respectively the second process.

The means for receiving can comprise a user interface. For example, software or hardware or a mixture thereof can enable the user of the apparatus to provide information about the first and/or second process. The apparatus can then automatically select the sets of parameters accordingly with the aid of the means for determining (e.g., a computer unit, a processor, etc.). A semi-automatic selection is also conceivable, wherein the apparatus offers the user a selection of sets of parameters adapted for the respective process, from which the user can then make a final selection.

The apparatus can be configured such that the means for receiving information is able to receive information that identifies the first process as a diagnostic process and/or the second process as a repair process.

Provision can also be made for the apparatus for processing a lithographic mask not to comprise means for guiding a particle beam onto the mask. It can be provided for example as a separate hardware device provided for interaction with a device for guiding the particle beam onto the mask, for example by way of a (software) interface for providing information about the sets of intrinsic beam parameters and/or the first and/or second process. In addition or as an alternative to an apparatus for this purpose, a corresponding computer program can also be provided.

The apparatuses described herein can comprise a means for providing at least one precursor gas, such that the particle beam excites a chemical reaction of the at least one precursor gas at the mask.

The apparatuses described herein can generally be designed to carry out the methods described herein. Conversely, all aspects described with regard to the apparatuses in the present case can also be carried out as method steps.

In accordance with a further aspect of the invention, a computer program is provided. The computer program comprises executable instructions that are designed, when executed by a computer, to carry out the steps of one of the methods described herein.

BRIEF DESCRIPTION OF DRAWINGS

The following detailed description describes currently preferred exemplary embodiments of the invention, with reference being made to the following drawings:

FIGS. 2A-2B: Cross-sectional view for interaction volumes of the particle beam and secondary electron contribution at high and respectively low particle energy.

FIG. 3: Schematic diagram of the secondary electron contribution as a function of the particle energy.

FIG. 4: Flow diagram for a method for repairing a defect of a lithographic mask with a particle beam.

DETAILED DESCRIPTION

Currently preferred embodiments of the present invention are explained in greater detail below with reference to the drawings.

Figures 1A, 1B, 1C:
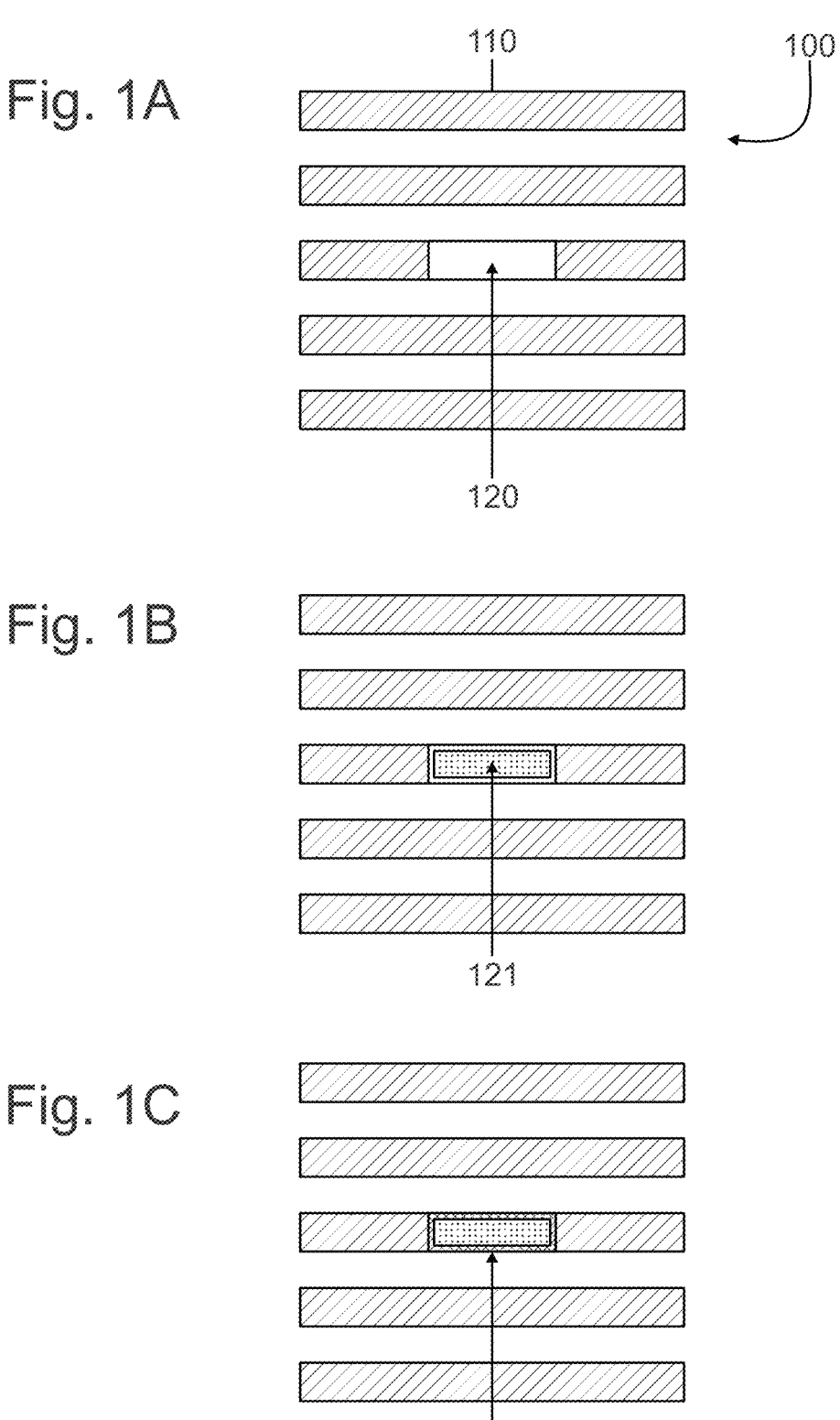
FIGS. 1A-1C: Example of a defect of a photomask and a classification of the defect into a set of marginal pixels and a set of non-marginal pixels and also into a set of edge pixels and non-edge pixels.

FIGS. 1A-1C show an exemplary lithographic mask 100 (hereinafter for short: mask 100) with a defect 120 in accordance with one example.

FIG. 1A shows an exemplary pattern 110 of the mask 100. The pattern 110 is illustrated as an absorbent pattern comprising horizontally illustrated strips of absorbent material that absorbs radiation during exposure. Radiation that impinges on the photomask 100 between the strips during exposure can penetrate through the photomask and expose the object, e.g., a wafer coated with photosensitive material, on the opposite side of the photomask. One of the strips has a defect 120. The absorbent material is at least partly missing in the region of the defect 120. The defect 120 is illustrated by way of example as a rectangular structure. During exposure, radiation that impinges on the region of the defect 120 can therefore penetrate by mistake at least partly through the mask 100. The defect 120 is thus illustrated by way of example as a clear defect 120. In order to repair the mask 100, absorbent material can be deposited in the region of the defect 120. The geometry of the pattern 110 and also the nature of the defect as a clear defect are merely by way of example.

Besides two-dimensional coordinates (e.g., x, y coordinates) that can extend in the mask plane, the defect 120 can also have three-dimensional coordinates (e.g., z coordinate) that can indicate a depth of the defect.

In the prior art, defects such as the defect 120 were repaired with exactly the same beam and process parameters. This is not always optimal, particularly in the case of large-area defects.

In order to improve the repair, the defect 120, as shown in FIGS. 1B and 1C, is divided into a first region 121 and a second region 122. The first and respectively the second region can be formed by a first and respectively second (geometrically) continuous set of pixels of the defect 120 (or of the repair shape of the defect 120).

The first set of pixels (region 121) can be formed for example by one or more non-marginal pixels of the defect 120. The second set of pixels (region 122) can be formed for example by one or more marginal pixels of the defect 120.

The first set of pixels 121 can be exposed for example with beam and/or process parameters that lead to a processing mode with relatively low resolution, relatively low accuracy, but relatively high throughput. For example, a high beam current, a high particle energy, a high gas flow and/or a large pixel size (e.g., of the particle beam) can be used.

The second set of pixels 122 can be exposed for example with beam and/or process parameters that lead to a processing mode with relatively high resolution, relatively high accuracy, but relatively low throughput. For example, a low beam current, a low particle energy, a low gas flow and/or a small pixel size (e.g., of the particle beam) can be used.

Alternatively or additionally, the second set of pixels 122 (marginal pixels) can be subdivided into edge pixels 122a and non-edge pixels 122b. The edge pixels 122a can be exposed for example with beam and/or process parameters that lead to a processing mode with relatively high resolution, relatively high accuracy, but relatively low throughput. For example, a low beam current, a low particle energy, a low gas flow and/or a smaller pixel size (e.g., of the particle beam) can be used in comparison with beam and/or process parameters for the non-marginal pixels 121 and/or for the non-edge pixels 122b. The same beam and/or process parameters as for the non-marginal pixels 121 can be used for the non-edge pixels 122b. However, it is also possible for a lower beam current, a lower particle energy, a lower gas flow and/or a smaller pixel size (e.g., of the particle beam) to be used for the non-edge pixels 122b in comparison with beam and/or process parameters for the non-marginal pixels 121.

The processing of the first set of pixels 121 and of the second set of pixels 122 and also of the sets 122a and 122b can be carried out simultaneously, in an alternating manner (in parallel) or temporally successively.

For example, for the marginal pixels and/or edge pixels, a pixel size of the of the repair shape of $1$-$10$ nm$^2$, preferably $1$-$5$ nm$^2$, can be provided, e.g., $1*1$ nm$^2$, $2*2$ nm$^2$. For the non-marginal pixels and/or non-edge pixels and/or volume pixels, a pixel size of the repair shape can be larger, e.g., $5$-$25$ nm$^2$, preferably $10$-$25$ nm$^2$, e.g., $2*2$ nm$^2$, $3*3$ nm$^2$, $4*4$ nm$^2$ or $5*5$ nm$^2$.

For example, for the marginal pixels and/or edge pixels, a pixel size of the particle beam of $1$-$10$ nm$^2$, preferably $1$-$5$ nm$^2$, can be provided, e.g., $1*1$ nm$^2$, $2*2$ nm$^2$. For the non-marginal pixels and/or non-edge pixels and/or volume pixels, a pixel size of the particle beam can be larger, e.g., $5$-$40$ nm, preferably $10$-$25$ nm$^2$, e.g. $2*2$ nm$^2$, $3*3$ nm$^2$, $4*4$ nm$^2$, $5*5$ nm$^2$ or $6*6$ nm$^2$.

It is also possible to indicate the pixel size (of the particle beam or of the repair shape) in units of the minimum focus diameter of the particle beam.

The assignment of the pixels of a repair shape for a defect 120 to one or more sets of pixels can also be regarded as segmentation of the repair shape into one or more sub-repair shapes (each of which comprises a set of pixels). The processing of the sets of pixels can then be effected in particular in temporal succession, namely by sequential processing of the individual sub-repair shapes. The sequence of repair shapes and the respective process steps and parameters thereof can be stored in a common file, for example. The latter can then be processed by a corresponding apparatus, as described herein.

FIGS. 2A-2B show the effects of a change in the particle energy during the processing of a substrate 200 of a mask by way of example on the basis of an electron beam 220. The electron beam 220 can be incident on the substrate 200, e.g., approximately perpendicularly. A relatively high particle energy of the electrons leads to a relatively large interaction volume 225 with the substrate 220 (FIG. 2A). A relatively low particle energy leads to a relatively small interaction volume with the substrate (FIG. 2B). The interaction volume 225 is approximately drop-shaped in cross section, with the tip of the drop oriented in the direction of the incident beam

220, whereas the drop can have an approximately round shape on the side which is opposite to the incident beam 220. The depth of the drop generally increases with the particle energy, just like the average diameter of the drop in the direction of the particle beam.

By use of a suitable choice of the particle energy (e.g., by use of adapting the accelerating voltage), it is thus possible to set the "coarseness" of the grid with the aid of which the repair is effected—both in the plane of the mask and in the z-direction. By way of example, simulations of the secondary electrons from a quartz surface allow the following estimation: At an accelerating voltage of 1 kV, secondary electrons emerge in a radius of up to ~25 nm around the impingement location of the primary beam. At an accelerating voltage of only 0.6 kV or 0.2 kV, said radius decreases so as to be up to ~15 nm or up to ~10 nm, respectively.

Situated around the tip of the drop there are generally zones 240 from which secondary electrons are released upon bombardment with the particle beam. The size or extent of these zones 240 of the substrate also depends on the particle energy of the incident particle beam. At a high particle energy said zones tend to be somewhat deeper and also to have a larger surface area in the substrate plane. Exit surfaces for secondary electrons thus form at the top side facing the particle beam of the substrate.

FIG. 3 shows an exemplary functional relationship 300 between the particle energy and the secondary electron yield. The relationship is shown by way of example for an electron beam and the yield of secondary electrons n per incident electron is shown as a function of the energy of the electrons (in keV). With higher energy of the electrons, firstly the yield of secondary electrons rises from a value close or equal to zero. At a particle energy of approximately 0.15 keV, the secondary electron yield is then approximately n=1. This point is identified by the reference sign 340 in FIG. 3. Subsequently, the rise of n levels out somewhat and reaches a local maximum 320 of approximately n=2 at a particle energy of approximately 0.5 keV. Subsequently, the yield decreases again, reaches a value of n=1 (reference sign 360) again at an energy of approximately 2 keV and then decreases further with higher particle energy.

In some exemplary embodiments, it may be helpful, for the purpose of processing a lithographic mask, to carry out a first process with a different set of intrinsic beam parameters in comparison with a second process. First and respectively second processes in this sense can be, e.g.: Image recording processes for generating a repair shape, process for creating at least one drift correction marker, actual repair process (e.g., particle-beam-induced etching and/or deposition), process for drift correction during the actual repair process, end pointing process (which ascertains whether material has already been removed to the desired depth and/or whether the material has already been deposited with the desired thickness), image recording process for verifying the repair.

In some exemplary embodiments, it may be helpful, for the purpose of processing a lithographic mask, to carry out a first process with a different accelerating voltage for the particle beam (e.g., electrons or ions) in comparison with a second process. For example, a process for generating a repair shape and/or a process for imaging can be carried out with a different accelerating voltage in comparison with the actual repair process on the basis of the generated repair shape. The accelerating voltages can each be optimized independently of one another even though the processes serve for repair and diagnostics of one and the same defect and can be carried out without removing the mask from the apparatus that provides the particle beam. In accordance with one example, the voltages can each be optimized for different successive processes (e.g., image recordings and/or repair steps) concerning the same defect.

In accordance with one example, an imaging process (for creating the repair shape and/or for checking the repair that has been effected) is carried out with a higher accelerating voltage in order to obtain a high image resolution. For this purpose, for example, backscattered electrons/ions can be detected, e.g., with the aid of the technique of energy selective backscattering (EsB). Conversely, for the subsequent repair process (with local etching and/or local deposition with the aid of a precursor gas), a lower accelerating voltage can be used in order to obtain a high repair resolution. This is because with a lower accelerating voltage the extent of the zones 240 (cf. FIG. 2) from which secondary electrons are released upon bombardment with the particle beam is smaller. Accordingly, the local chemical reaction used for the repair is locally better delimited and the repair resolution is increased. By way of example, for the actual repair in the case of an electron beam and a mask for EUV, it is possible to use an accelerating voltage of 50 to 1200 V, of 100 to 1200 V, of 200 to 1200 V, of 300 to 1000 V, of 400 to 800 V, or of 500 to 700 V, preferably 550 to 650 V or approximately 600 V. For the imaging process, it is possible to use, e.g., a voltage of >2 kV, for example 2 to 5 kV, 2 to 4 kV, 2,5 to 3,5 kV or approximately 3 kV.

In a further example, the accelerating voltage for the imaging process can be chosen such that the secondary electron yield is approximately 1. This may be helpful in particular if sample charging effects might result in problems. In the case of an electron beam, the accelerating voltage can have values of approximately 300 to 700 V, 400 to 600 V, 450 to 550 V, or approximately 500 V. For the actual repair, it is possible to use by example (e.g., in the case of an electron beam and/or a mask for EUV) an accelerating voltage which allows a desired resolution, e.g., an optimum resolution using 50 to 1200 V, 100 to 1200 V, 200 to 1200 V, 300 to 1000 V, 400 to 800 V, or 500 to 700 V, preferably 550 to 650 V or approximately 600 V.

In a further example, the accelerating voltage for the imaging process (before or after or else during the actual repair process) can be chosen such that a material contrast is optimized (e.g., by energy selective detection of backscattered electrons by use of an EsB detector). In another example, the accelerating voltage for the imaging process (before or after or else during the actual repair process) can be chosen such that edge effects are minimized (edges appear at the correct position). Moreover, it is possible to choose the accelerating voltage for the imaging process (before or after or else during the actual repair process) such that edge effects are maximized (edges are then more clearly recognizable). For the actual repair, in each case by way of example (e.g., in the case of an electron beam and/or an EUV mask), it is possible to use a different accelerating voltage which allows a desired repair resolution, e.g., an optimum resolution using 50 to 1200 V, 100 to 1200 V, 200 to 1200 V, 300 to 1000 V, 400 to 800 V, or 500 to 700 V, preferably 550 to 650 V or approximately 600 V.

In the above examples, the accelerating voltage is merely by way of example. Other voltages (e.g., sample bias voltage) can also be varied and accordingly used as various parameters for first and second processes.

In some examples, for the purpose of processing a lithographic mask, different pixel sizes are used for a first and a second process. The pixel sizes can be optimized independently of one another for the respective process.

In accordance with one example, the repair shape is generated with a first pixel size. The actual repair can be effected (at least partly) with a different pixel size (of the particle beam). By way of example, the pixels of the repair shape can be divided into a first and respectively a second set of pixels. The pixel size of the particle beam for repairing the first and second sets can then be optimized in each case for the first and respectively the second set, as described herein.

However, it is also possible to use a different pixel size for the actual repair without dividing the repair shape into a plurality of sets of pixels. For example, the pixel size (of the particle beam) can be chosen depending on the geometry of the repair shape. It can be chosen such that the repair can be effected with as far as possible an integral number of pixels. It can be chosen depending on a total area of the defect and/or a complexity of a contour of the defect.

It is also possible for at least one further parameter (beam and/or process parameter) to be optimized toward the pixel size used in the respective process. In the apparatuses of the present invention, for example, an automatic optimization of the further parameters toward the pixel size respectively used can be effected which optionally includes an (automatic) check as to whether the pixel size respectively selected is expedient and/or allowed. It is thus possible to prevent the (isolated) selection of a specific pixel size from resulting in errors in the process.

In accordance with one example, two repair processes are carried out. In a first process, an overcorrection is effected. For example, material is deposited over a larger area (or etched away over a larger area) than that corresponding to the extent of the defect. In a second step, the deposited material is then partly etched away again (or, respectively, material is deposited), such that the remaining material reproduces the contours of the defect as well as possible. For example, the first process can be carried out with one or more parameters for low resolution. For example, the second process can be carried out with one or more parameters for high resolution. This can be advantageous in order to rapidly realize a (large-area) repair approximately corresponding to the defect. In a second step, the refinements necessary for the precise repair can then be carried out. The (slow) process with high resolution then need only be carried out across a smaller area. In another example, the first process can be carried out with one or more parameters for high resolution and the second process can be carried out with one or more parameters for low resolution.

In particular as a result of varying the beam and/or process parameters, it may be necessary to ensure matching between different images. This is because the mask may expand or warp differently on account of the various possible thermal loads. Moreover—in particular when using an electron beam—the particle beam may be deflected to different extents as a result of different static charging. For this purpose, it is possible to create and/or use markings on the mask. However, it is also possible to ensure matching by use of a prediction on the basis of a model. One example of this is disclosed in DE 10 2018 209 562 B3. Further development of the model for different parameters—as described in the present case—may make it unnecessary to use markings on the mask. Especially since markings also degrade over time and should therefore be scanned as infrequently as possible, this is advantageous in particular if—as in the present case—different parameters are intended to be used and the need for an adaptation of the correction of displacements or distortions thus increases. By way of example, it is possible to ascertain empirically what changes in specific parameters cause what changes in the images. However, a model that physically calculates the changes and/or predicts them on the basis of machine learning is also possible.

An apparatus for processing a lithographic mask and/or for repairing a defect of a lithographic mask can comprise the following: (a) Means for recording measurement data while the mask is exposed to the particle beam; and (b) means for predetermining a drift of the beam of charged particles relative to the lithographic mask with a trained machine learning model and/or a predictive filter, wherein the trained machine learning model and/or the predictive filter use(s) at least the measurement data as input data. In particular, the predictive filter and/or the trained model can make it possible to ascertain from a drift for a specific set of processing parameters (beam parameters and/or process parameters) a drift for a changed set of processing parameters, such that the correction of the drift upon a change of the processing parameters in a second process only has to be effected relative to the correction already effected in a first process.

A further aspect to be considered is that the Point Spread Function (PSF) of the imaging system can be adapted, if appropriate, taking account of material effects of the mask, particularly if parameters are changed in the processes—as described in the present case. For this purpose, provision can be made for measuring the PSF. The measurement can be effected for different sets of parameters that are also used subsequently. However, it is also possible for one or more measurements to be effected only for one or more selected sets of parameters, from which the PSF is then ascertained for the sets of parameters used subsequently in each case. For this purpose, it is possible to effect an interpolation or extrapolation or a complex conversion on the basis of mathematical models.

The measurement can be effected for example with the aid of a sample as described for instance in DE 10 2018 210 522 A1. Alternatively or additionally, two or more images of a reference structure can be recorded specifically under different recording conditions. PSFs can be generated for the two or more recorded images with a modified reference image of the reference structure, for example by recording images in the form of a focus stack.

The image recorded in each case can then be deconvolved with the PSF respectively measured or ascertained on the basis of measurement data, optionally taking account of material effects. Finally, the repair shape can be generated from the image thus sharpened.

FIG. 4 shows an exemplary flow diagram for a method for processing a lithographic mask or respectively for repairing a defect of the mask.

The method can firstly comprise a process 440 for creating drift correction markers. This optional process 410 can be carried out at the start of the method. However, it is also possible to carry it out at a later point in time. The drift correction markers can be observed—e.g., during processing—and so a drift or a distortion can be corrected.

The method can additionally comprise the process of recording 410 image information with regard to a defect. The recording can be effected using a particle beam, for example by use of an electron beam, which can be provided by an SEM (cf. FIG. 5).

Creating a repair shape 420 can be provided as a further process. The repair shape can be created for example by a computer system (cf. FIG. 5). For this purpose, information from the recording in accordance with process 410 can be used, for example. The creating can be effected by a computer system integrated into an apparatus for providing the particle beam (for example into an apparatus comprising an SEM, cf. FIG. 5). Alternatively, however, the computer system can also obtain the corresponding information from the recording by way of an interface, for example by way of a user interface or some other interface (to a data carrier, server, Internet, etc.). The computer system can also obtain information from some other, e.g., previously used, measuring apparatus (e.g., AIMS, AFM (Atomic Force Microscope)) and use it to create the repair shape. Furthermore, inputs by the user can also be taken into account in the process of creating the repair shape by use of the computer system, which inputs can be received by way of a user interface.

In a further step 430, at least one first pixel of the defect and at least one second pixel of the defect can be selected. The selection can be effected at least partly manually by the user with the aid of the user interface. However, the selection can also be effected at least partly automatically by the computer system.

In a further step (not illustrated), it is possible to define a first and a second set of processing parameters for the processing of the at least one first pixel and respectively the at least one second pixel with the aid of the computer system. This defining can also be effected at least partly automatically and/or at least partly manually with the aid of the user interface.

In a further process 450, the defect, in particular the at least one first pixel, can be processed with the particle beam and the first set of processing parameters. The further process 460 of drift correction can be effected during this processing.

In an additional process 470, the defect, in particular the at least one second pixel, can be processed with the particle beam and the second set of processing parameters. During this processing, too, the further process 460 of drift correction can be effected, but usually with changed correction parameters.

Finally, it is possible to effect a further process of recording image information with regard to the defect for "end pointing" 480 and/or recording image information for verifying the repair of the defect 490.

Figure 5:
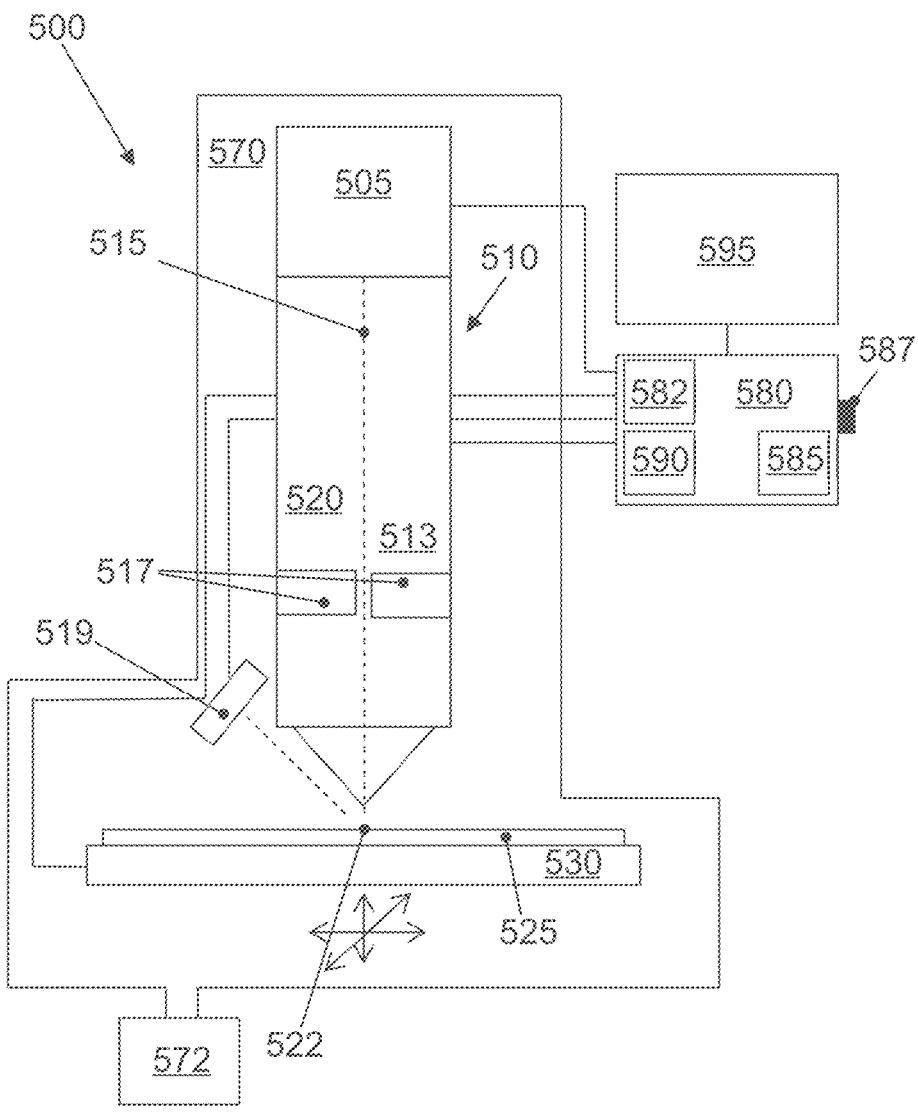
FIG. 5: Schematic diagram for an apparatus for repairing a defect of a lithographic mask with a particle beam.

FIG. 5 shows a schematic section through some important components of an apparatus 500 which can be used for processing and repairing (one or more defects of) a lithographic mask. The exemplary apparatus 500 in FIG. 5 comprises a modified scanning particle microscope 510 in the form of a scanning electron microscope (SEM) 510.

The apparatus 500 comprises a particle beam source 505 in the form of an electron beam source 505, which generates an electron beam 515 as particle beam 515. An electron beam 515 has the advantage—compared with an ion beam—at the electrons that impinge on the sample 525 or the lithographic mask substantially cannot damage the sample or the mask. However, it is also possible to use an ion beam, an atomic beam, a molecular beam or a photon beam (not illustrated in FIG. 5) for the purpose of processing the sample 525 in the apparatus 500.

The scanning particle microscope 510 is composed of an electron beam source 505 and a column 520, in which is arranged the beam optical unit 513 for instance in the form of an electron optical unit of the SEM 510. In the SEM 510 in FIG. 5, the electron beam source 505 generates an electron beam 515, which is directed as a focused electron beam 515 onto the sample 525, which can comprise the lithographic mask, at the location 522 by the imaging elements arranged in the column 520, said imaging elements not being illustrated in FIG. 5. The beam optical unit 513 thus forms the imaging system 513 of the electron beam source 505 of the SEM 500.

Further, the imaging elements of the column 520 of the SEM 510 can scan the electron beam 515 over the sample 525. The sample 525 can be examined using the electron beam 515 of the SEM 510.

The backscattered electrons and secondary electrons generated by the electron beam 515 in the interaction region of the sample 525 are registered by the detector 517. The detector 517 arranged in the electron column 520 is referred to as an "in lens detector." The detector 517 can be installed in the column 520 in various embodiments. The detector 517 converts the secondary electrons generated by the electron beam 515 at the measurement point 522 and/or the electrons backscattered from the sample 525 into an electrical measurement signal and transmits the latter to an evaluation unit 585 of a computer system 580 of the apparatus 500. The detector 517 can contain a filter or a filter system in order to discriminate the electrons in terms of energy and/or solid angle (not reproduced in FIG. 5). The detector 517 is controlled by a setting unit 590 of the apparatus 500.

The exemplary apparatus 500 can include a second detector 519. The second detector 519 can be designed to detect electromagnetic radiation, in particular in the X-ray range. As a result, the detector 519 makes it possible to analyze a material composition of the radiation generated by the sample 525 during the examination thereof. The detector 519 is likewise controlled by the setting unit 590.

Further, the apparatus 500 can comprise a third detector (not illustrated in FIG. 5). The third detector is often embodied in the form of an Everhart-Thornley detector and typically arranged outside the column 520. As a rule, it is used to detect secondary electrons.

The apparatus 500 can comprise an ion source that provides ions with low kinetic energy in the region of the sample 525 (not illustrated in FIG. 5). The ions with low kinetic energy can compensate for charging of the sample 525. Furthermore, the apparatus 500 can comprise a mesh at the output of the column 520 of the modified SEM 510 (likewise not shown in FIG. 5). Electrostatic charging of a sample 525 can likewise be compensated for by applying a voltage to the mesh. It is furthermore possible to earth the mesh.

The sample 525 is arranged on a sample stage 530 or a sample holder 530 for examination purposes. A sample stage 530 is also known as a "stage" in the art. As symbolized by the arrows in FIG. 5, the sample stage 530 can be moved in three spatial directions relative to the electron beam 515 of the SEM 510, for example by way of micro-manipulators that are not illustrated in FIG. 5.

Besides the translational movement, the sample stage 530 can be rotated at least about an axis oriented parallel to the beam direction of the particle beam source 505. It is furthermore possible for the sample stage 530 to be embodied such that it is rotatable about one or two further axes, this axis or these axes being arranged in the plane of the sample stage 530. The two or three axes of rotation preferably form a rectangular coordinate system. As can be gathered from FIG. 5, the rotation of the sample stage 530 about an axis of rotation that is arranged in the plane of the sample stage 530 is often possible only to a limited extent on account of the small distance between the end of the column and the sample 525.

The sample 525 to be examined can be any arbitrary microstructured component or device that requires analysis and, if appropriate, subsequent processing, for example the repair of a local defect of a lithographic mask. In this regard, the sample 525 can comprise for example a transmissive or a reflective photomask and/or a template for nanoimprint technology. The transmissive and the reflective photomask can comprise all types of photomasks, for instance binary masks, phase-shifting masks, OMOG (opaque MoSi on glass) masks, or masks for a double or multiple exposure.

Further, the apparatus 500 in FIG. 5 can comprise one or more scanning probe microscopes, for example in the form of an atomic force microscope (AFM) (not shown in FIG. 5), which can be used to analyze and/or process the sample 525.

The scanning electron microscope 510 illustrated by way of example in FIG. 5 is operated in a vacuum chamber 570. In order to generate and maintain a reduced pressure required in the vacuum chamber 570, the SEM 510 in FIG. 5 has a pump system 572.

The apparatus 500 includes a computer system 580. The computer system 580 can form the means described herein for receiving information about a first and a second process and/or the means for determining a first and a second set of intrinsic beam parameters for the first and respectively the second process.

Moreover, the computer system 580 can form the means described herein for receiving information about the defect and/or the means for determining at least one first pixel of the defect for processing with the particle beam with a first set of processing parameters and at least one second pixel of the defect for processing with the particle beam with a second set of processing parameters, on the basis of the information.

The computer system 580 can also comprise a scanning unit 582, which scans the electron beam 515 over the sample 525. Furthermore, it can comprise a setting unit 590 in order to set the various parameters of the modified scanning particle microscope 510 of the apparatus 500. Furthermore, the setting unit 590 can control the deflection system and rotation of the sample stage 530.

Moreover, the computer system 580 can comprise an evaluation unit 585, which analyzes the measurement signals of the detectors 517 and 519 and generates an image of the sample 525 therefrom, which image can be displayed in a graphical user interface of the computer system 580, which can comprise a display 595 and input means. In particular, the evaluation unit 585 can be designed to determine the position and a contour of a defect of missing material and/or a defect of excess material of a sample 525, for instance of the lithographic mask, from the measurement data of the detector 517. The evaluation unit 585 can additionally contain one or more algorithms which make it possible to determine a repair shape corresponding to the analyzed defect of the mask. The evaluation unit 585 of the computer system 580 can additionally include one or more algorithms that can ascertain the parameters (beam and/or process parameters) of specific processes. The algorithms of the evaluation unit 585 can be implemented using hardware, software or a combination thereof. In particular, the algorithm(s) can be realized in the form of an ASIC (Application Specific Integrated Circuit) and/or an FPGA (Field Programmable Gate Array).

The computer system 580 and/or the evaluation unit 585 can include a memory (not illustrated in FIG. 5), preferably a non-volatile memory, which stores one or more models of repair shapes for various mask types. The evaluation unit 585 can be designed to calculate, on the basis of a repair model, a repair shape for the defect(s) of the lithographic mask from the measurement data of the detector 517. Furthermore, the computer system 580 can comprise an interface 587 for exchanging data with the Internet, an Intranet and/or some other apparatus. The interface 587 can comprise a wireless or a wired interface.

As indicated in FIG. 5, the evaluation unit 585 and/or the setting unit 590 can be integrated into the computer system 580. However, it is also possible to embody the evaluation unit 585 and/or the setting unit 590 as independent unit(s) within or outside the apparatus 500. In particular, the evaluation unit 585 and/or the setting unit 590 can be designed to carry out some of their tasks by use of a dedicated hardware implementation.

The computer system 580 can be integrated into the apparatus 500 or can be embodied as an independent device (not shown in FIG. 5). The computer system 580 can be embodied using hardware, software, firmware or a combination.

What is claimed is:

1. A method for repairing a defect of a photolithographic mask with a particle beam, comprising:
   a. processing the defect of the photolithographic mask with the particle beam with a first set of processing parameters; and
   b. processing the defect of the photolithographic mask with the particle beam with a second set of processing parameters;
   c. wherein at least one parameter from the first set of processing parameters differs from the second set of processing parameters;
   d. wherein at least one marginal pixel of the defect of the photolithographic mask is processed with the first set of processing parameters and at least one non-marginal pixel of the defect of the photolithographic mask is processed with the second set of processing parameters.

2. The method of claim 1, wherein a first section of the defect of the photolithographic mask is repaired with the aid of a first set of processing parameters and a second section of the defect of the photolithographic mask is repaired with the aid of a second set of processing parameters, wherein the first section does not overlap the second section.

3. The method of claim 2, wherein the processing of a pixel of the defect of the photolithographic mask is effected selectively either with the first or the second set of processing parameters, depending on the position of the pixel in the defect of the photolithographic mask.

4. The method of claim 2, wherein at least one edge pixel of the defect of the photolithographic mask is processed with the first set of processing parameters, and/or at least one non-edge pixel and/or volume pixel of the defect of the photolithographic mask are/is processed with the second set of processing parameters.

5. The method of claim 2, wherein the at least one parameter from the first set of processing parameters comprises at least one of the following elements: a lower beam current, a lower beam flux, a lower beam fluence, a lower particle energy, or a smaller pixel size than defined by the second set of processing parameters.

6. The method of claim 1, wherein the processing of a pixel of the defect of the photolithographic mask is effected selectively either with the first or the second set of processing parameters, depending on the position of the pixel in the defect of the photolithographic mask.

7. The method of claim 1, wherein at least one edge pixel of the defect of the photolithographic mask is processed with the first set of processing parameters, and/or at least one non-edge pixel and/or volume pixel of the defect of the photolithographic mask are/is processed with the second set of processing parameters.

8. The method of claim 1, wherein the at least one parameter from the first set of processing parameters comprises at least one of the following elements: a lower beam current, a lower beam flux, a lower beam fluence, a lower particle energy, or a smaller pixel size than defined by the second set of processing parameters.

9. The method of claim 8 wherein the at least one parameter from the first set of processing parameters comprises a lower beam current, and the at least one parameter from the second set of processing parameters comprises a higher beam current.

10. The method of claim 8 wherein the at least one parameter from the first set of processing parameters comprises a lower beam flux and the at least one parameter from the second set of processing parameters comprises a higher beam flux.

11. The method of claim 8 wherein the at least one parameter from the first set of processing parameters comprises a lower beam fluence, and the at least one parameter from the second set of processing parameters comprises a higher beam fluence.

12. The method of claim 8 wherein the at least one parameter from the first set of processing parameters comprises a lower particle energy, and the at least one parameter from the second set of processing parameters comprises a higher particle energy.

13. The method of claim 8 wherein the at least one parameter from the first set of processing parameters comprises a smaller pixel size than defined by the second set of processing parameters.

14. The method of claim 1, furthermore comprising providing at least one precursor gas, such that the particle beam excites a chemical reaction of the at least one precursor gas at the mask.

15. A computer program comprising executable instructions that are designed, when executed by a computer, to carry out the steps of the method of claim 1.

16. The method of claim 1 wherein at least one edge pixel of the defect of the photolithographic mask is processed with the first set of processing parameters, and at least one non-edge pixel and/or volume pixel of the defect of the photolithographic mask are/is processed with the second set of processing parameters.

17. The method of claim 1 wherein the processing the defect of the photolithographic mask with the first set of processing parameters and the second set of processing parameters comprises at least one of local particle-beam-induced etching or local particle-beam-induced deposition.

18. The method of claim 1, comprising from among pixels of the defect of the photolithographic mask, determining a first set of pixels of the defect that are marginal pixels of the defect, and from among the pixels of the defect of the photolithographic mask, determining a second set of pixels that are non-marginal pixels of the defect.

19. A method comprising:

repairing a defect of a photolithographic mask with a particle beam, comprising:

processing at least one marginal pixel of the defect of the photolithographic mask with the particle beam with a first set of processing parameters with a higher precision and a slower speed; and processing at least one non-marginal pixel of the defect of the photolithographic mask with the particle beam with a second set of processing parameters with a lower precision and a higher speed;

wherein at least one parameter from the first set of processing parameters differs from the second set of processing parameters.

20. The method of claim 19 wherein the particle beam comprises at least one of:

an electron beam, an ion beam, a beam comprising atoms, a beam comprising molecules, or a light beam.

* * * * *